United States Patent
Lu

(10) Patent No.: US 9,148,970 B2
(45) Date of Patent: Sep. 29, 2015

(54) POWER SUPPLY MODULE

(75) Inventor: Shao-Feng Lu, Taoyuan County (TW)

(73) Assignee: 3Y POWER TECHNOLOGY (TAIWAN), INC., Taoyuan (TW)

( * ) Notice: Subject to any disclaimer, the term of this patent is extended or adjusted under 35 U.S.C. 154(b) by 85 days.

(21) Appl. No.: 13/570,261

(22) Filed: Aug. 9, 2012

(65) Prior Publication Data

US 2013/0039019 A1 Feb. 14, 2013

(30) Foreign Application Priority Data

Aug. 9, 2011 (CN) ...................... 2011 2 0287214 U

(51) Int. Cl.
| | |
|---|---|
| H05K 7/02 | (2006.01) |
| H05K 7/06 | (2006.01) |
| H05K 7/14 | (2006.01) |
| G06F 1/18 | (2006.01) |

(52) U.S. Cl.
CPC ........ *H05K 7/02* (2013.01); *G06F 1/189* (2013.01); *H05K 7/06* (2013.01); *H05K 7/1492* (2013.01)

(58) Field of Classification Search
CPC .. G11B 33/125; G11B 33/126; G11B 33/127; G11B 33/128; H05K 7/1492; H05K 7/06; G06F 1/189
USPC ......... 361/601–603, 636, 640, 645–647, 650, 361/728–733, 736, 740, 742, 747, 759, 760, 361/737, 784, 785, 801–804, 807, 810, 361/679.01, 679.02, 625; 174/50.52, 535, 174/536, 538, 542, 559–563, 53–58; 439/218
See application file for complete search history.

(56) References Cited

U.S. PATENT DOCUMENTS

| | | | | |
|---|---|---|---|---|
| 4,936,785 | A * | 6/1990 | Krug et al. ...................... 439/75 |
| 5,805,420 | A * | 9/1998 | Burke ............................ 361/727 |
| 6,493,230 | B2 * | 12/2002 | Clidaras et al. ............... 361/730 |
| 7,200,004 | B2 * | 4/2007 | Chen et al. ................ 361/679.39 |
| 8,248,771 | B2 * | 8/2012 | Chang ....................... 361/679.02 |
| 8,274,181 | B2 * | 9/2012 | Lu ................................... 307/147 |
| 8,416,564 | B2 * | 4/2013 | Chang ........................ 361/679.4 |
| 2008/0278898 | A1 * | 11/2008 | Huang ............................ 361/683 |
| 2009/0175015 | A1 * | 7/2009 | Mukouyama ................. 361/785 |
| 2010/0225306 | A1 * | 9/2010 | Slaton ........................... 324/149 |

* cited by examiner

*Primary Examiner* — Jerry Wu
*Assistant Examiner* — Christopher L Augustin
(74) *Attorney, Agent, or Firm* — Jianq Chyun IP Office

(57) ABSTRACT

A power supply module adapted to supply power to a peripheral device includes a power supply and an output-structure detachably assembled to the power supply and electrically connected between the power supply and the peripheral device. The height of the output-structure relatively to the bottom portion of the power supply is adjustable and the power supply, output-structure and the peripheral device together form a concave combination-structure. As a result, by using a separated output-structure in the invention, the power supply is able to maneuverably adjust the interconnection position of the peripheral device and the power supply through the second circuit board. Meanwhile, the power supply has a larger usable space therein.

7 Claims, 5 Drawing Sheets

POWER SUPPLY MODULE

CROSS-REFERENCE TO RELATED APPLICATION

This application claims the priority benefit of China application serial no. 201120287214.3, filed on Aug. 9, 2011. The entirety of the above-mentioned patent application is hereby incorporated by reference herein and made a part of this specification.

BACKGROUND

1. Field of the Utility Model

The present invention generally relates to a power supply module, and particularly, to a power supply module having an output-structure with adjustable height.

2. Description of Related Art

In the modern nowadays of developed electronics industry, various electronic devices are mostly accompanied by a power supply to provide power. In general, the main purpose of the power supply is to convert an AC (alternating current) into a stable DC power (direct current power) for the needs of various electronic devices.

FIG. 6 is a side-view diagram of a conventional power supply. Referring to FIG. 6, a power supply 600 has a circuit board 610 of a power supply module fixed in the casing 620 thereof and a goldfinger structure 612 extends out of the casing 620 available to electrically connect the connecting portion 310 of an external device 300 to the power supply 600. To adapt the variety or replacement need of the external device, the position of the connecting portion may vary, so that the goldfinger structure 612 must be adjustable to suit the height of the external electronic device. For example, when the height of the connecting portion after altering relatively to the bottom portion thereof is higher than the one shown in FIG. 6, the circuit board of the power supply should adjust the height accordingly. However, it is often to fail adjusting the corresponding height of the circuit board 610 limited by the dimension interference between the electronic components 630 on the circuit board 610 and the casing 620.

In other words, under a limited interior space condition of the casing 620, the goldfinger structure 612 is unable to adjust the relative position thereof along with the external device 300. In this regard, how to make the height of the goldfinger structure 612 conform the relative position of the external device 300 and meanwhile to take into account the usable space in the casing for accommodating the electronic components 630 has become an issue for the people skilled in the art to consider and resolve.

SUMMARY OF THE DISCLOSURE

Accordingly, the present invention is directed to a power supply module, which has better space utilization through employing a movable output-structure.

The present invention provides a power supply module adapted to supply power to a peripheral device, in which the peripheral device has a connecting portion. The power supply module includes a power supply and an output-structure, which is detachably assembled to the power supply and electrically connected between the power supply and the peripheral device. The height of the output-structure herein relatively to a bottom portion of the power supply is adjustable that the output-structure correspondingly connects the connecting portion of the peripheral device, and the power supply, the output-structure and the peripheral device together form a concave combination-structure.

Based on the description above, in the embodiment of the invention, since the power supply module is electrically connected to the connecting portion of the peripheral device through the output-structure and the height of the output-structure relatively to a bottom portion of the power supply is adjustable, the power supply is able to suit the peripheral device with a connecting portion in different heights, which advances the adaptability of the power supply. In addition, with the above-mentioned design, the electronic components in the power supply are no more limited by the corresponding position of the connecting portion of the peripheral device. Instead, a movable output-structure serves as the connection between the power supply and the peripheral device, so that the power supply has a sufficient space therein for disposing the electronic components. In this way, the designer has no worry about sacrificing the usable space in the casing due to the consideration of meeting the requirement of the interconnection position of the peripheral device. That is to say, by using a separated output-structure in the invention, the power supply is able to adjust the interconnection position of the peripheral device and the power supply. Meanwhile, the power supply has a larger usable space therein.

Other objectives, features and advantages of the invention will be further understood from the further technological features disclosed by the embodiments of the invention wherein there are shown and described preferred embodiments of this invention, simply by way of illustration of modes best suited to carry out the invention.

DESCRIPTION OF THE EMBODIMENTS

Figure 1:
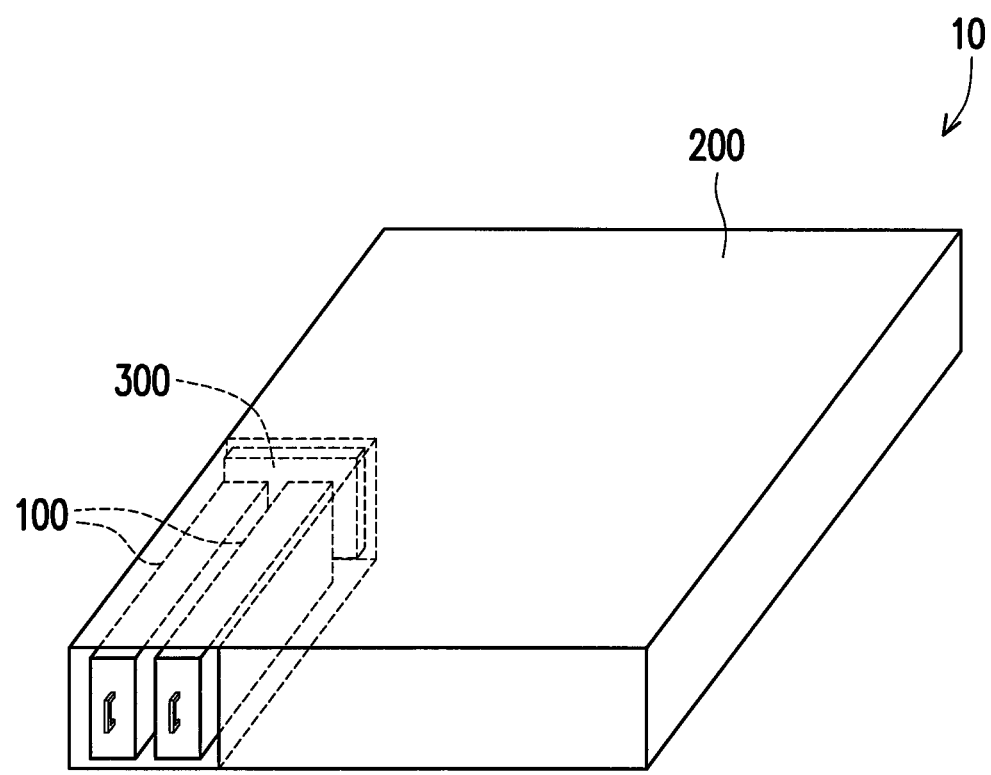
FIG. 1 is a schematic diagram of an electronic device according to an embodiment of the invention.
Figure 2:
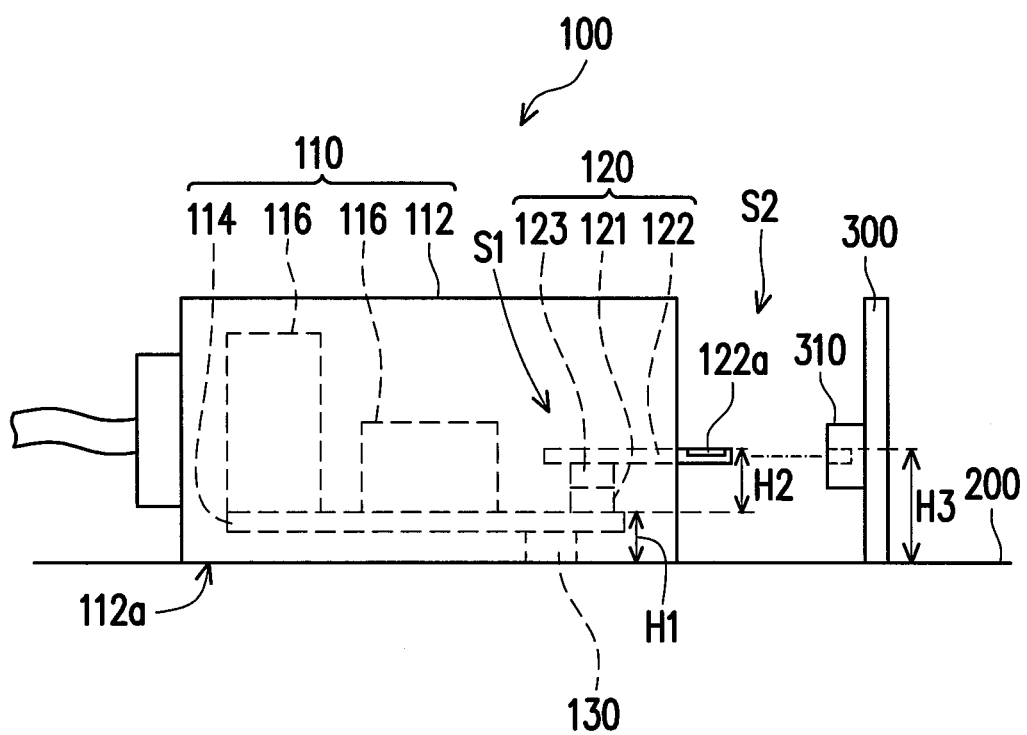
FIG. 2 is a side-view diagram of the power supply module in the electronic device of FIG. 1.

FIG. 1 is a schematic diagram of an electronic device according to an embodiment of the invention and FIG. 2 is a side-view diagram of the power supply module in the electronic device of FIG. 1. Referring to FIGS. 1 and 2, in the embodiment, an electronic device 10 is, for example, a server or a large storage. There are a plurality of electronic modules (not shown) disposed in the chassis 200 of the electronic device 10, and at least one replaceable power supply module 100 provides power to the electronic modules to keep the operation thereof. In the embodiment, two power supply modules 100 are shown and belong to the server's standby power system. The running mode of the two power supply modules 100 in the server is referred as [1+1], in which the second [1] represents the quantity of the power supply module allowed to stop the operation in the standby power system. For example, during both the two power supply modules 100 are normally running, the power required by the server's electronic module is simultaneously provided by the two power supply modules 100; however, when one of the power supply modules 100 stops operation or gets failure, the other one 100 needs to be in charge to provide whole power of server's electronic module so that the server keeps the running thereof without being affected. The invention does not limit the above-mentioned configuration, and the designer can even appropriately modify the quantity or power distribution of the power supply modules 100 according to the real need of the server. In addition, the power supply modules 100 can be adapted to a PC or other electronic devices, which the invention is not limited to.

The power supply module 100 includes a power supply 110 and an output-structure 120. The power supply 110 includes a casing 112, a first circuit board 114 and a plurality of electronic components 116, in which the casing 112 is assembled into the chassis 200 and has a bottom portion 112a. The electronic components 116 are disposed on the first circuit board 114 and together with the first circuit board 114 disposed in the casing 112. The electronic components 116 herein are, for example, transformer, capacitors and so on which are welded on the first circuit board 114.

The output-structure 120 is detachably assembled to the power supply 110 and electrically connected between the power supply 110 and the peripheral device 300 to form a concave combination-structure. In this way, in addition to facilitating the power supply module 100 for swapping relatively to the peripheral device 300, the heat-dissipating efficiency of the concave combination-structure is advanced through the exposed output-structure 120 during providing power to the peripheral device 300.

In the embodiment, the peripheral device 300 is, for example, a circuit backboard disposed in the chassis 200, which is electrically connected to a motherboard (not shown) at another location in the chassis 200, so that the power provided by the power supply module 100 can be integrated and transmitted to the motherboard. The peripheral device 300 has a connecting portion 310 to facilitate the output-structure 120 correspondingly connecting the connecting portion 310 for transmitting power. It should be noted that the height of the output-structure 120 relatively to a bottom portion 112a of the casing 112 in the invention is adjustable, i.e., by disposing different peripheral device 300, the adaptability of the power supply module 100 can be advanced by adjusting the position of the output-structure 120.

Figure 3:
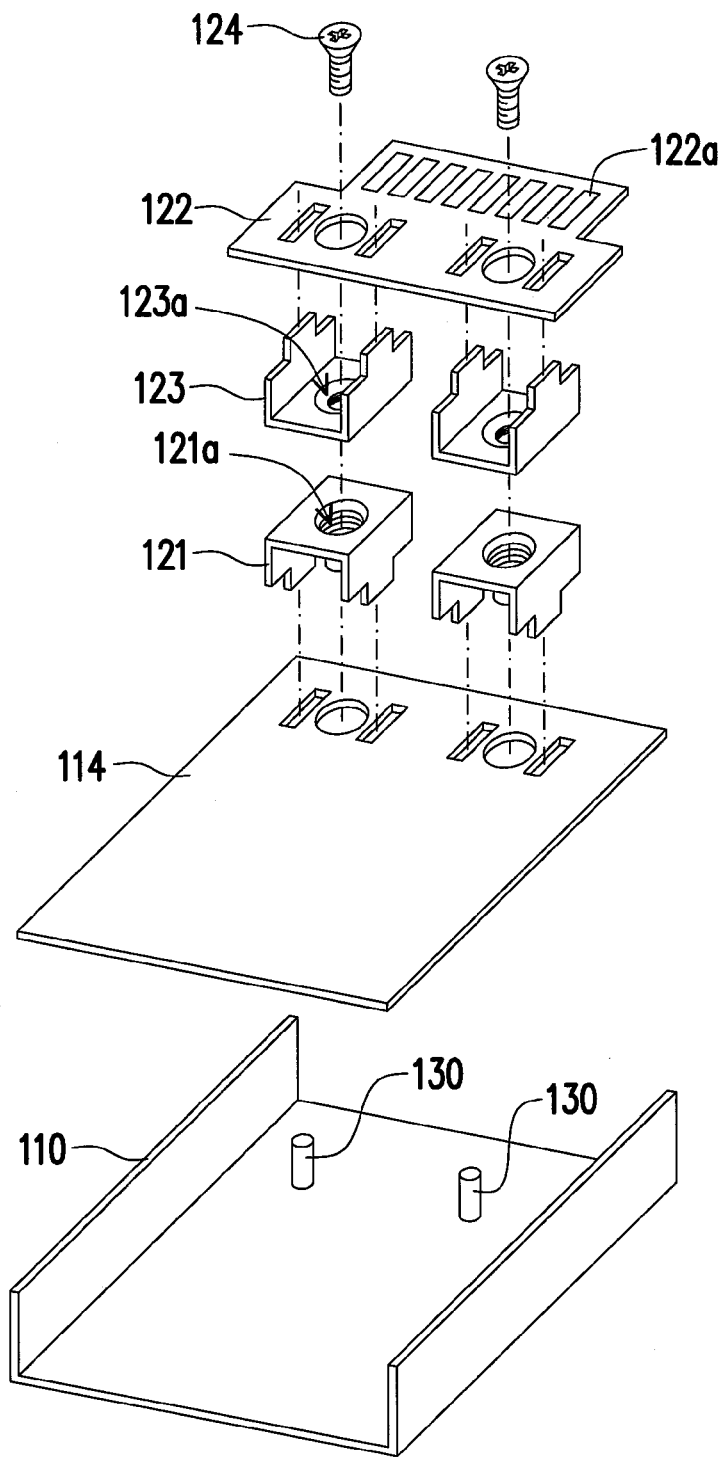
FIG. 3 is an assembling diagram of partial parts in the power supply module of FIG. 2.

In more details, referring to FIG. 2, in the embodiment, the output-structure 120 includes a second circuit board 122, a first conductive part 121 and a second conductive part 123. The second circuit board 122 has a first side S1 and a second side S2, in which the first conductive part 121 and the second conductive part 123 are stacked and electrically connected between the first side S1 of the second circuit board 122 and the first circuit board 114. FIG. 3 is an assembling diagram of partial parts in the power supply module of FIG. 2. Referring to FIGS. 2 and 3, the first conductive part 121 and the second conductive part 123 herein are respectively a U-shape copper rail and the slots thereof are back to back. The first conductive part 121 and the second conductive part 123 are respectively welded on the first circuit board 114 and the second circuit board 122, in which the second conductive part 123 has a countersink 123a and the first conductive part 121 has a thread hole 121a. After the first conductive part 121 and the second conductive part 123 are stacked with each other, a fastener 124 is fastened into the thread hole 121a and locked in the countersink 123a so as to fasten the first conductive part 121 and the second conductive part 123 together and further to fix the second circuit board 122 over the first circuit board 114.

It should be noted that the first circuit board 114 has a first height H1 relatively to the bottom portion 112a of the casing 112, while the second circuit board 122 has a second height H2 relatively to the first circuit board 114, in which the second height H2 is substantially composed of the thickness of the second circuit board 122, the first conductive part 121 and the second conductive part 123. In other words, when the thicknesses of the first circuit board 114 and the second circuit board 122 are fixed, the user can use the first conductive part 121 and the second conductive part 123 with different heights to facilitate the second circuit board 122 having a height corresponding to the connecting portion 310 to suit the corresponding position of the connecting portion 310 of the peripheral device 300. At the time, through the detachable and adjustable structure feature, the user can also to adjust the second height H2 conveniently. The first height H1 herein is the height of the top surface of the first circuit board 114 relatively to the bottom portion 112a, and the second height H2 is the height of the top surface of the second circuit board 122 relatively to the top surface of the first circuit board 114. In comparison with the conventional design of the power supply module 600 with a single circuit board, the designer, in the invention, has no worry about the different height of the connecting portion 310 of the peripheral device 300 in the power supply module 100 of the invention through the detachable and adjustable feature of the first conductive part 121 and the second conductive part 123. In addition to advancing the adaptively of the power supply module 100, the invention can further reduce the design and manufacturing costs.

For example, the dimensions of the electronic components 116 disposed on the first circuit board 114 are increased according to an increasing in power specification of the power supply, which causes the height H1 of the first circuit board 114 relatively to the bottom portion 112a is reduced as much as possible, such that the electronic components 116 is adapted to be accommodated in the casing 112. As a result, the dimensions of the first conductive part 121 and the second conductive part 123 need to be adjusted to make the sum of the first height H1 and the second height H2 equal to a third height H3 of the connecting portion 310 relatively to the bottom portion 112a, such that the power supply 110 connects to the peripheral device 300 successfully. In the same way, the third height H3 is the height of the top surface of the connecting portion 310 relatively to the bottom portion 112a.

In addition, not only the second circuit board 122 connects to the peripheral device 300, but also the electronic components 116 are received in the casing 112 by the first conductive part 121 being detachably assembled to the second conductive part 123 between the first circuit board 114 and the second circuit board 122. It should be noted that the first conductive part 121 and the second conductive part 123 are surface contacted with each other, i.e., since the first conductive part 121 and the second conductive part 123 are copper rail structures wherein the slots thereof are back to back, the contacting area between the first circuit board 114 and the second circuit board 122 is larger to allow a larger current passing through and reduce a possible current loss, which thereby advances the power of the power supply module 100 provided to the peripheral device 300. On the other hand, through the copper rail structures of the first conductive part 121 and the second conductive part 123, a better heat-dissipating effect during the current passes through is achieved to advance the efficiencies of the power supply module 100 and the peripheral device 300. Based on the above-mentioned mechanism, the power supply module 100 can collect or distribute the currents to better suit the application in a standby power system of a large storage or a server.

In the embodiment, the goldfinger structure 122a is disposed at the second side S2 of the second circuit board 122 and inserted into the connecting portion 310 of the peripheral device 300 (for example, inserted into a slot on the circuit backboard), which the invention is not limited to. In another unshown embodiment, a connector in layout of board to board is respectively disposed the second side of the second circuit board and the peripheral device, which can achieve the effect of the above-mentioned embodiment.

In the embodiment, the power supply module 100 further includes a supporting part 130 assembled between the bottom portion 112a of the casing 112 and the first circuit board 114, in which the height H1 of the first circuit board 114 relatively to the bottom portion 112a is substantially the sum of the height of the supporting part 130 and the thickness of the board of the first circuit board 114. The height of the supporting part 130 can be determined according to the pins protrusive from the first circuit board 114 of the electronic components 116 disposed on the first circuit board 114. Therefore, the height of the supporting part 130 is not defined and limited. In fact, in the embodiment, any design able to make the output-structure 120 of the power supply 110 conform to the condition that the sum of the first height H1 and the second height H2 is equal to the third height H3 of the connecting portion 310 can be adapted to the invention, in which both the first height H1 and the second height H2 can be appropriately modified.

Figure 4:
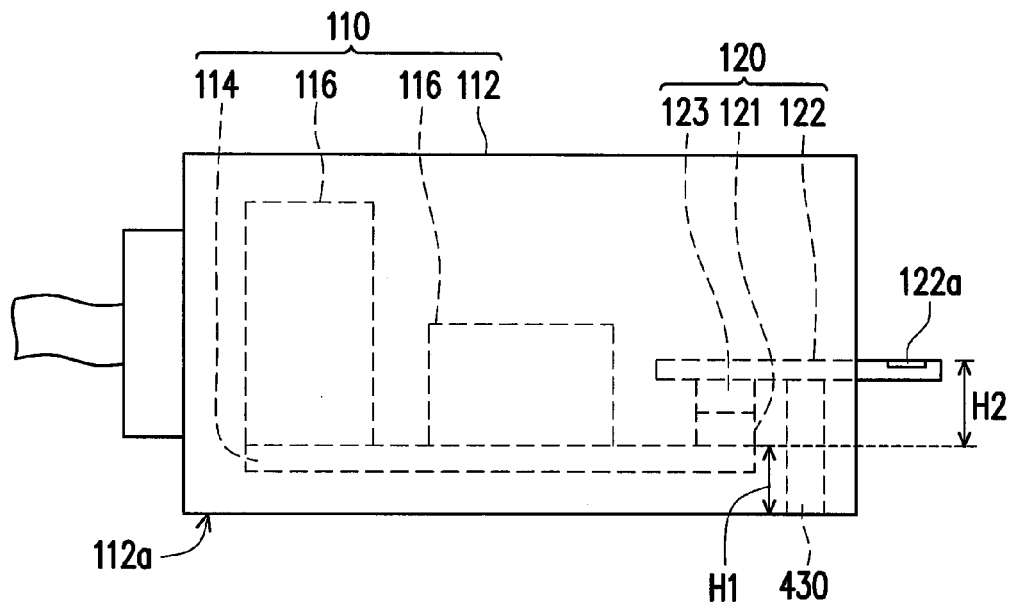
FIG. 4 is a schematic diagram of a power supply module according to another embodiment of the invention.

FIG. 4 is a schematic diagram of a power supply module according to another embodiment of the invention. Referring to FIG. 4, the difference of the embodiment from the above-mentioned one rests in the supporting part 430 of the power supply module 400 are assembled between the bottom portion 112a of the casing 112 and the second circuit board 122. In this way, the sum of the first height H1 of the first circuit board 114 relatively to the bottom portion 112a and the second height H2 of the second circuit board 122 relatively to the first circuit board 114 is equal to the height of the supporting part 430. As a result, the power supply module 400 has the same effect of the above-mentioned embodiment. It can be seen the embodiment does not limit the corresponding layout between the supporting part and the circuit board. In fact, any modified design able to make the sum of the first height H1 and the second height H2 equal to the third height H3 can meet the demand of the invention.

Figure 5:
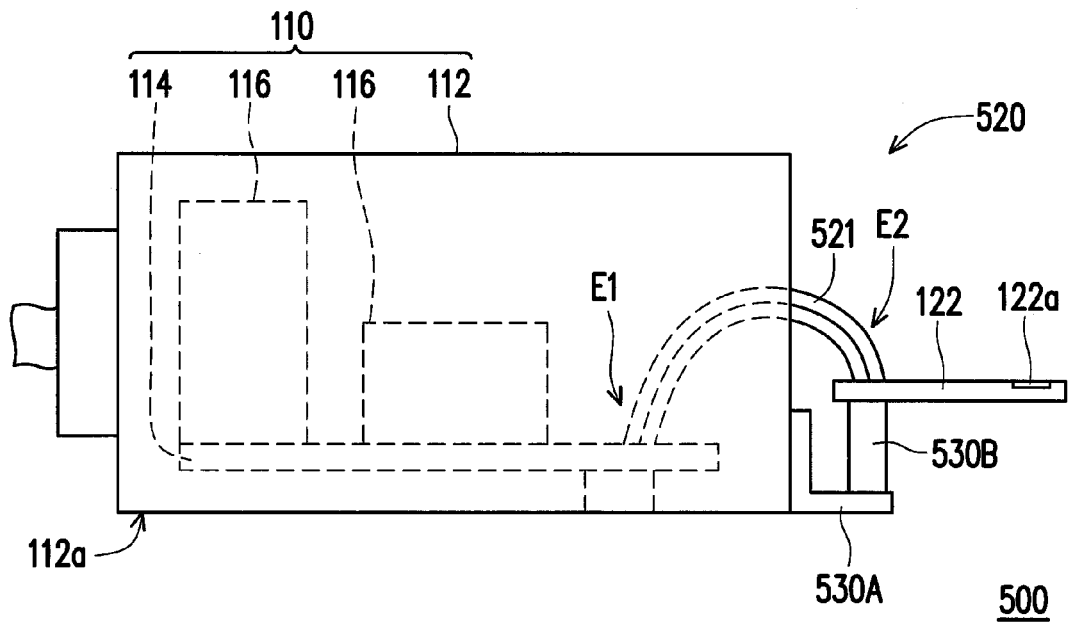
FIG. 5 is a schematic diagram of a power supply module according to yet another embodiment of the invention.
Figure 6:
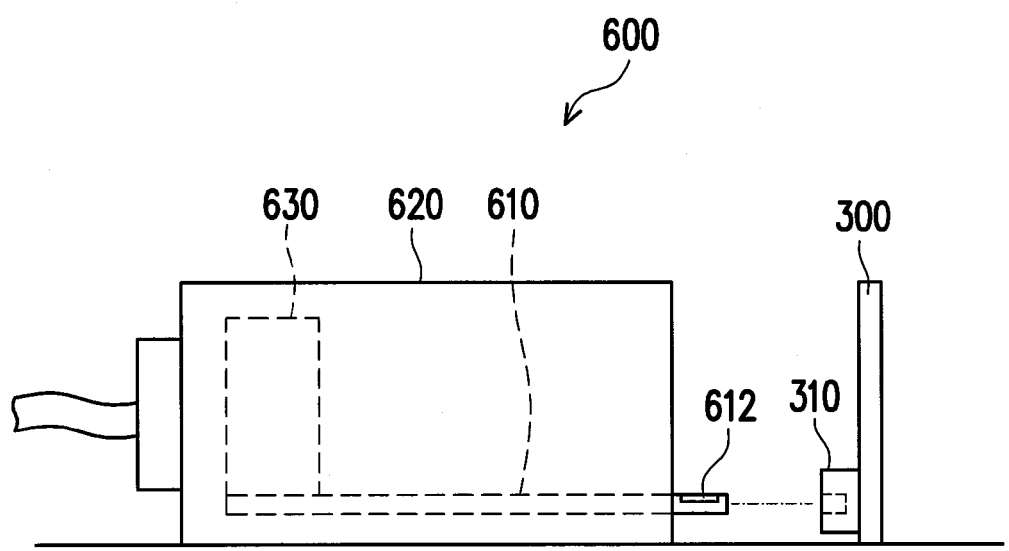
FIG. 6 is a side-view diagram of a conventional power supply.

FIG. 5 is a schematic diagram of a power supply module according to yet another embodiment of the invention. Differently from the above-mentioned embodiments, the output-structure 520 of the power supply module 500 includes a wire 521, through the flexibility of the wire 521 and the first end E1 and the second end E2 thereof are relatively movable, the first end E1 of the wire 521 is welded on the first circuit board 114, while the second end E2 of the wire 521 is welded on the second circuit board 122. At the time, the second circuit board 122 is movable relatively to the first circuit board 114 so that the goldfinger structure 122a has higher freedom to be connected to the corresponding peripheral device 300 (in FIG. 2). In other words, the user can assemble the movable output-structure 520 on the power supply 110 to make the power supply 110 adapted to the peripheral device 300 in different specifications (shown in FIG. 3) so as to advance the adaptive range of the power supply module 500 and reduce the manufacturing cost thereof.

The invention does not limit the connecting structure design between the output-structure 520 and the peripheral device 300. Although in the embodiment, the goldfinger structure 122a of the second circuit board 122 is electrically connected to the peripheral device 300 the same as the above-mentioned embodiment, but in another unshown embodiment, instead the second circuit board 122, a connector in layout of board to board can be used to achieve the effect the same as the above-mentioned embodiment.

In order to make the power supply module 500 applicable to a replaceable structure of the standby power system shown by FIG. 1, the power supply module 500 can further include an L-shape stand 530A and a supporting part 530B, in which the L-shape stand 530A is externally connected on the casing 112 and the bottom portion of the L-shape stand 530A and the bottom portion of the casing 112 are coplane with each other. The supporting part 530B is assembled at the second circuit board 122 and the L-shape stand 530A. The height of the second circuit board 122 relatively to the bottom portion of the L-shape stand 530A is just the height of the connecting portion 310 of the peripheral device 300 relatively to the bottom portion 112a (shown in FIG. 2), so that after the power supply module 500 is inserted into the chassis 200, the second circuit board 122 (or the connector in layout of board to board) and the peripheral device 300 of the chassis 200 (i.e., the backboard) can be interconnected to each other.

In summary, in the embodiments of the invention, through the detachable and movable output-structure of the power supply module, the power supply not only has a sufficient space to accommodate the electronic components, but also can match the height of the connecting portion of the peripheral device. As a result, the designer has no worry about sacrificing the usable space in the casing due to the consideration of meeting the requirement of the interconnection position of the peripheral device. That is to say, by using a separated output-structure in the invention, the power supply is able to maneuverably adjust the interconnection position of the peripheral device and the power supply through the second circuit board. Meanwhile, the power supply has a larger usable space therein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power supply module, adapting to the position of a peripheral device, wherein the peripheral device has a connecting portion and the power supply module comprises:
   a power supply having a casing and a first circuit board, the first circuit board is disposed in the casing and having a first height relatively to a bottom portion of the casing; and
   an output-structure detachably assembled to the power supply and electrically connected between the power supply and the peripheral device, the output-structure has a second circuit board and a wire, the second circuit board is electrically connected between the first circuit board and the connecting portion and having a second height relatively to the first circuit board, the wire is electrically connected between the first circuit board and the second circuit board, wherein the sum of the first height and the second height is substantially equal to the height of the connecting portion relatively to the bottom portion and a height of the output-structure relatively to the bottom portion of the casing is adjustable for being positioned with the connecting portion correspondingly, and the power supply is able to suit the peripheral device with the connecting portion in different heights.

2. The power supply module as claimed in claim 1, wherein the height of the output-structure relatively to the bottom portion is equal to a height of the connecting portion relatively to the bottom portion.

3. The power supply module as claimed in claim 1, wherein the wire has a first end and a second end, the first end is electrically connected to the first circuit board, and the second end is movable relatively to the first end and electrically connected to the peripheral device in plugged manner.

4. The power supply module as claimed in claim 1, further comprising:
   a supporting part, assembled between the bottom portion of the casing and the first circuit board, wherein the first height is equal to the height of the supporting part.

5. The power supply module as claimed in claim 1, further comprising:
   a supporting part, assembled between the bottom portion of the casing and the second circuit board, wherein the sum of the first height and the second height is equal to the height of the supporting part.

6. The power supply module as claimed in claim 1, further comprising:
   an L-shape stand, connected on and outside the casing, wherein the bottom portion of the L-shape stand and the bottom portion of the casing are coplane with each other.

7. The power supply module as claimed in claim 1, wherein the output-structure comprises:
   a connector, correspondingly inserted into the connecting portion.

* * * * *